United States Patent [19]
Okaguchi

[11] Patent Number: 5,854,428
[45] Date of Patent: Dec. 29, 1998

[54] VIBRATION GYROSCOPE

[75] Inventor: Kenjiro Okaguchi, Shiga-ken, Japan

[73] Assignee: Murata Manufacturing Co., Ltd., Japan

[21] Appl. No.: 801,204

[22] Filed: Feb. 18, 1997

[30] Foreign Application Priority Data

Feb. 16, 1996 [JP] Japan .................................. 8-029356

[51] Int. Cl.[6] .................................................. G01C 19/00
[52] U.S. Cl. ........................ 73/504.12; 310/315; 310/319
[58] Field of Search ........................... 73/504.03, 504.04, 73/504.12, 504.14, 504.15; 310/315, 316, 319

[56] References Cited

U.S. PATENT DOCUMENTS 5,635,787  6/1997  Mori et al. ............................... 310/316

FOREIGN PATENT DOCUMENTS 0645602  9/1994  European Pat. Off. .
5302833  4/1992  Japan .
7239232  2/1994  Japan .

*Primary Examiner*—Hezron Williams
*Assistant Examiner*—Richard A. Moller
*Attorney, Agent, or Firm*—Ostrolenk, Faber, Gerb & Soffen, LLP

[57] ABSTRACT

A vibration gyroscope having stable sensitivity characteristic against temperature change has an amplifier circuit which amplifies a detection signal derived from a piezoelectric vibrator. The amplifier circuit includes an input terminal, an operational amplifier having a non-inversion input connected to the input terminal and an inversion input which is grounded, an output terminal connected to the output of the operation amplifier, a first temperature-sensitive element connected between the non-inversion input of the operation amplifier and the ground, and a second temperature-sensitive element connected between the inversion input of the operational amplifier and the output of the same.

10 Claims, 4 Drawing Sheets

VIBRATION GYROSCOPE

BACKGROUND OF THE INVENTION

1. Field of the Invention

The present invention relates to a vibration gyroscope having a piezoelectric vibrator and, more particularly, to a vibration gyroscope suitable for use in, for example, a navigation system which properly guides a moving body by detecting the position of the moving body upon sensing rotational angular velocity or in a vibration elimination system such as an anti-shaking device which adequately suppresses vibration upon sensing external vibration.

2. Description of the Related Art

In this type of vibration gyroscope, the level of the detection signal derived from the piezoelectric vibrator varies depending on a change in temperature, with the result that the sensitivity of the vibration gyroscope is also varied. For instance, the sensitivity, which is substantially constant at temperatures around 25° C., progressively decreases in accordance with a fall or rise of the temperature in lower or higher temperature regions, as indicated by the broken-line curve A in FIG. 7.

Hitherto, in order to overcome this problem, a temperature-sensitive element such as a thermistor is incorporated in an amplifier circuit which amplifies the detection signal derived from the piezoelectric vibrator or a signal related to the detection signal, so as to compensate for any change in the sensitivity attributable to temperature change.

FIG. 8 is a circuit diagram showing an example of the amplifier circuit which is used for the purpose of suppressing change in sensitivity caused by a change in temperature, and which is incorporated in the vibration gyroscope which exhibits characteristics shown by a broken-line curve A in FIG. 7. The amplifier circuit, which is generally designated by numeral 1, has an input terminal 3 which is connected to a non-inversion input of an operational amplifier 5. The inversion input of the operation amplifier 5 is grounded through a resistor R1. Between the inversion input of the operational amplifier 5 and the output of the same is connected a series circuit constituted by a resistor R2 and a thermistor 7 which has a negative temperature coefficient and which serves as the temperature-sensitive element. A resistor 3 is connected in parallel with the thermistor 7 of the negative temperature coefficient. An output terminal 9 is connected to the output of the operational amplifier 5. Thus, the amplifier circuit 1 decreases its amplification factor in accordance with a rise of the temperature.

The vibration gyroscope which inherently has characteristic as shown by broken-line curve A in FIG. 7 can be modified by the incorporation of the amplifier circuit 1, so as to exhibit a substantially constant level of sensitivity at temperatures around 25° C. and at lower temperature range, as indicated by the solid-line curve B in FIG. 7. However, no compensation at higher temperature region can be achieved with the use of this amplifier circuit. Consequently, rotation angular velocity cannot be accurately sensed at the higher temperature range in which the sensitivity is not stable.

SUMMARY OF THE INVENTION

Accordingly, it is an object of the present invention to provide a vibration gyroscope which has a high stability of sensitivity against change in temperature, thereby overcoming the above-described problem of the conventional art.

To this end, according to the present invention, there is provided a vibration gyroscope, comprising: a piezoelectric vibrator which generates a detection signal which varies with temperature; and an amplifier circuit which amplifies a detection signal derived from the piezoelectric vibrator, the amplifier circuit including an operational amplifier and at least two temperature-sensitive elements which are arranged in a circuit with said operational amplifier such that the amplification factor of said operational amplifier varies inversely to the variation in the detection signal caused by a change in temperature.

The phrase "derived from" as used in the specification and attached claims means directly derived from as well as indirectly derived from.

The amplifier circuit in its one form may comprises an input terminal which is connected to the non-inversion input of the operational amplifier, the inversion terminal of the operational amplifier being grounded, and an output terminal connected to the output of the operational amplifier, wherein the at least two temperature-sensitive elements include a first temperature-sensitive element connected between the inversion input of the operational amplifier and the ground, and a second temperature-sensitive element connected between the inversion input of the operational amplifier and the output of the operational amplifier.

The amplifier circuit in its another form may comprise an input terminal which is connected to the inversion input of the operational amplifier, the non-inversion input of the operational amplifier being grounded, and an output terminal connected to the output of the operational amplifier, wherein the at least two temperature-sensitive elements include a first temperature-sensitive element connected between the inversion input of the operational amplifier and the output of the operational amplifier, and a second temperature-sensitive element connected between the output of the operational amplifier and the ground.

The amplifier circuit in its still another form may comprise an input terminal which is connected to the inversion input of the operational amplifier, the non-inversion input of the operational amplifier being grounded, and an output terminal connected to the output of the operational amplifier; wherein the at least two temperature-sensitive elements include a first temperature-sensitive element connected between the input terminal and the inversion input of the operational amplifier, and a second temperature-sensitive element connected between the inversion input of the operational amplifier and the output of the operational amplifier.

According to the invention, the amplifier circuit, by virtue of the at least two temperature-sensitive elements incorporated therein, changes its amplification factor in a manner substantially inverse to the change in the detection signal derived from the piezoelectric vibrator in response to a change in the temperature. Consequently, a compensation is effected on the detection signal derived from the piezoelectric element such that the signal after the compensation is maintained substantially constant over a entire temperature range from low to high temperature regions, thus stabilizing the sensitivity of the vibration gyroscope against any change in temperature.

Thus, the vibration gyroscope in accordance with the present invention advantageously offers high accuracy in the detection of rotation angular velocity, over a entire range of temperature from low to high temperature regions, thanks to the high degree of stability of the sensitivity against any change in the temperature.

Other features and advantages of the present invention will become apparent from the following description of the invention which refers to the accompanying drawings.

DESCRIPTION OF THE PREFERRED EMBODIMENTS

Figure 1:
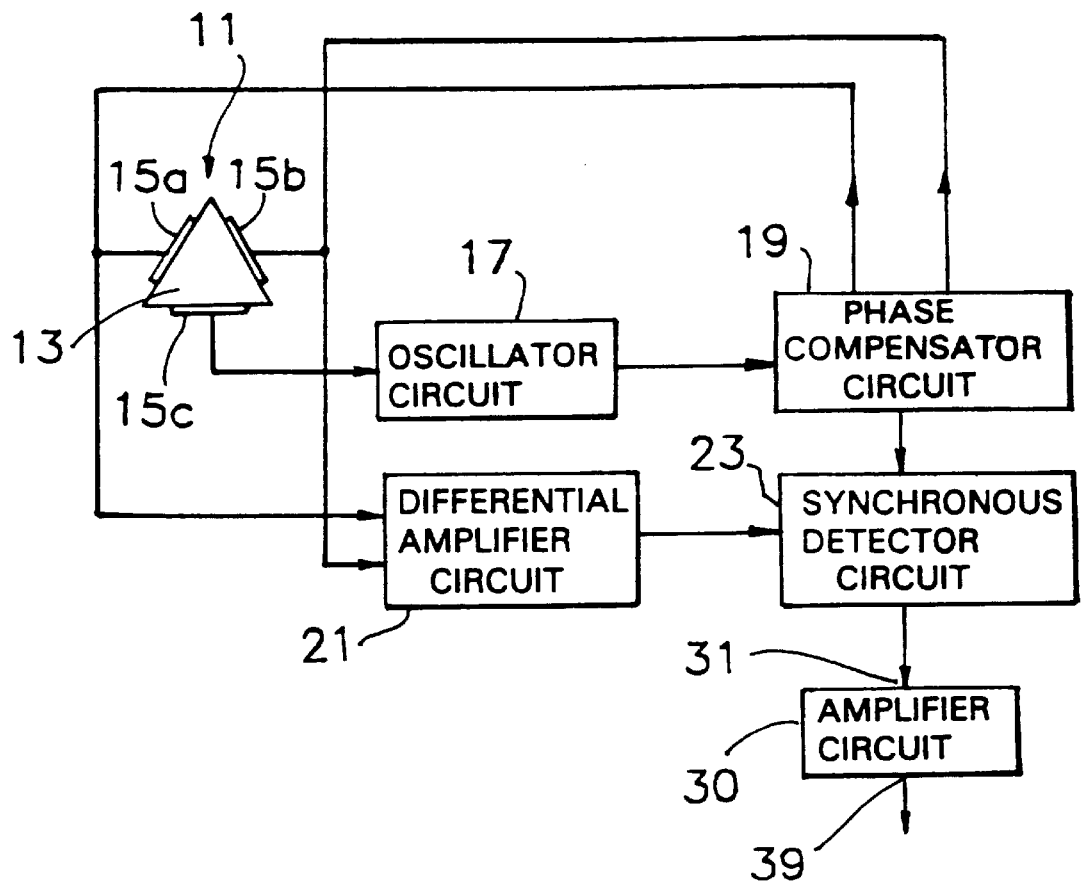
FIG. 1 is a block diagram showing the construction of a first embodiment of the vibration gyroscope in accordance with the present invention.

Referring to FIG. 1, the first embodiment of the vibration gyroscope, generally denoted by 10, has a piezoelectric vibrator 11.

The piezoelectric vibrator 11 has a vibration member 13 which is made of, for example, a metal and which has a columnar shape with an equilateral triangular cross-section. Three piezoelectric elements 15a, 15b, 15c are formed on the three side surfaces of the vibration member 13. Each of the piezoelectric elements 15a, 15b, 15c has a piezoelectric layer made of a piezoelectric material, and electrodes are formed on both major surfaces of the piezoelectric layer. One of the electrodes is adhered to the associated side surface of the vibration member 13, while the other electrode is used for signal input and output. In the operation of this piezoelectric vibrator 11, when two of the piezoelectric elements, e.g., 15a, 15b, receive similar driving signals while there is no rotation, the vibration member 13 vibrates so as to flex in the direction perpendicular to the major surface of the piezoelectric element 15c. In this state, similar detection signals are derived from the piezoelectric elements 15a, 15b. However, in the presence of an angular velocity of rotation about the axis of the vibration member 13 of the piezoelectric vibrator 11, the direction of the vibratory flexure of the vibration member 13 varies due to the Coriolis force, so that different detection signals corresponding to the angular velocity are derived from the piezoelectric elements 15a and 15b. The angular velocity acting on the vibration member 13 is determined based on the difference between the levels of the detection signals derived from these two piezoelectric elements 15a and 15b. In this embodiment, the piezoelectric vibrator 11 has such a characteristic that the levels of the detection signals from the two piezoelectric elements 15a and 15b vary in response to a change in the temperature.

The piezoelectric element 15c of the piezoelectric vibrator 11 is connected to the input of an oscillator circuit 17 which is constituted by, for example, an amplifier. The oscillator circuit 17 is intended to amplify a feedback signal derived from the piezoelectric element 15c so as to generate a driving signal for driving the piezoelectric vibrator 11.

The oscillator circuit 17 is connected at its output to the input of a phase compensator circuit 19. This phase compensator circuit 19 serves to optimize the phase of the driving signal derived from the oscillator circuit 17 for driving the piezoelectric vibrator 11.

Outputs of the phase compensator circuit 19 are connected to the piezoelectric elements 15a, 15b of the piezoelectric vibrator 11. Consequently, the piezoelectric elements 15a, 15b receive similar driving signals of a phase optimum for driving the piezoelectric vibrator 11.

The piezoelectric elements 15a, 15b of the piezoelectric vibrator 11 are respectively connected to the non-inversion input terminal and the inversion input terminal of a differential amplifier circuit 21 which serves to detect the difference between the detection signals derived from these piezoelectric elements 15a and 15b. The output terminal of the differential amplifier circuit 21 is connected to one of the input terminals of a synchronous detector circuit 23, to the other input terminal of which is connected to another output terminal of the phase compensator circuit 19. The synchronous detector circuit 23 serves to detect, in synchronization with the driving signal for driving the piezoelectric vibrator 11, the output from the differential amplifier circuit 21, i.e., the difference between the detection signals derived from both piezoelectric elements 15a, 15b, and to rectify the same into a D.C. signal.

The synchronous detector circuit 23 is connected at its output end to the input terminal of 31 of an amplifier circuit 30. This amplifier circuit 30 amplifies the D.C. signal derived from the synchronous detector circuit 23, while effecting temperature compensation on this D.C. signal which relates to the detection signals derived from the piezoelectric elements 15a, 15b.

Figure 2:
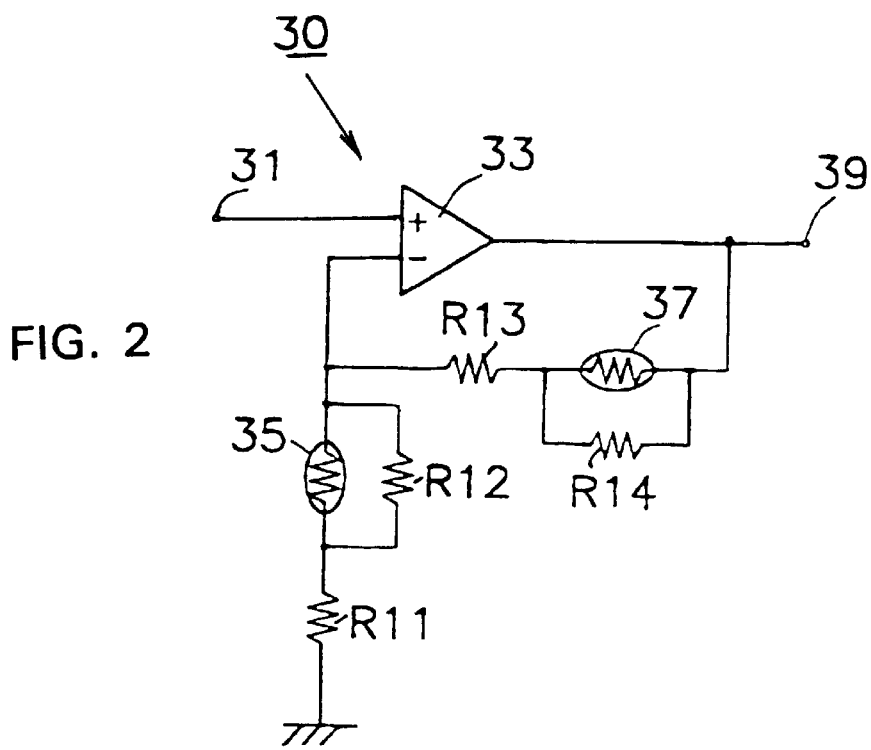
FIG. 2 is a circuit diagram showing the structure of an amplifier circuit incorporated in the vibration gyroscope of FIG. 1.

As will be seen from FIG. 2, the input terminal 31 of the amplifier circuit 30 is connected to the non-inversion input of an operational amplifier 33. The inversion input of this operational amplifier 33 is grounded through a series circuit constituted by a resistor R11 and a thermistor 35 which has a negative temperature coefficient and which serves as a temperature-sensitive element. A resistor R12 is connected in parallel with the thermistor 35 of the negative temperature coefficient. Between the inversion input terminal and the output of the same is connected a series circuit constituted by a resistor R13 and a thermistor 37 of a negative temperature coefficient. A resistor R14 is connected in parallel with the thermistor 37 of the negative temperature coefficient. The output of the operational amplifier 33 is connected to an output terminal 39.

In the operation of this vibration gyroscope, the piezoelectric elements 15a, 15b of the piezoelectric vibrator 11 are supplied with similar driving signals of a suitable phase, as a result of operations of an oscillating circuit 17 and the phase compensation circuit 19. Consequently, detection signals corresponding to the rotation angular velocity applied to the piezoelectric vibrator 11 are derived from the pair of piezoelectric elements 15a, 15b of the piezoelectric vibrator 12. The difference between the detection signals derived from the piezoelectric elements 15a and 15b is detected by the differential amplifier circuit 21. The synchronous detector circuit 23 detects the output of the differential amplifier circuit 21 in synchronization with the driving signal and rectifies the same into a D.C. signal. The D.C. signal output from the synchronous detector circuit 23 is amplified by the amplifier circuit 30. Thus, the vibration gyroscope 10 detects the rotation angular velocity applied to the piezoelectric element 11 based on the D.C. signal which is output from the amplifier circuit 30.

Furthermore, the vibration gyroscope 10 stably exhibits a substantially constant level of sensitivity over the entire temperature range from low to high temperature regions, by virtue of the temperature compensation effected by the amplifier circuit 30 on the D.C. signal which is output from the synchronous detector circuit 23.

Figure 3:
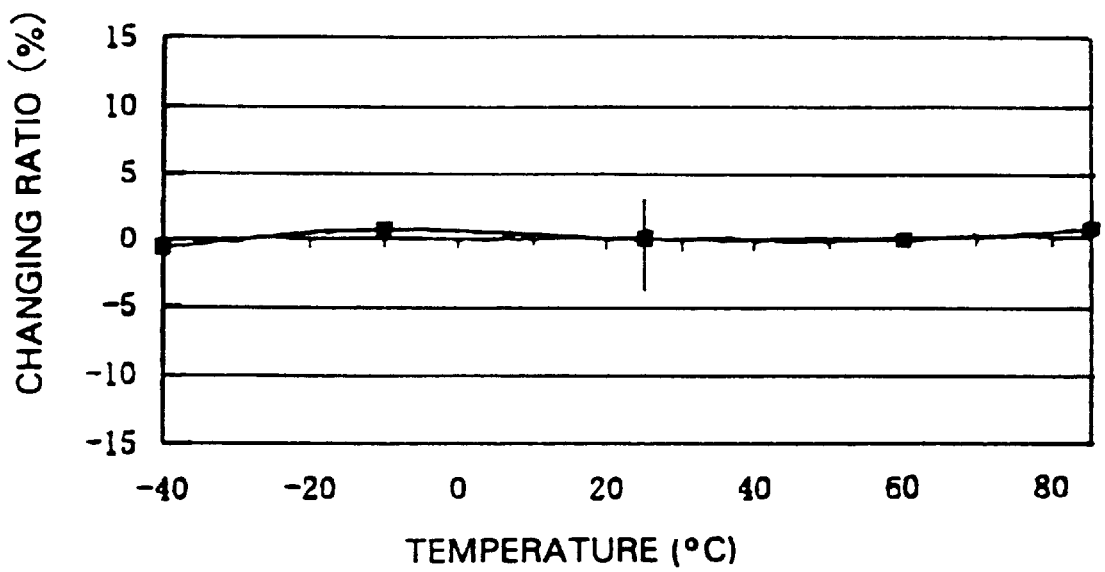
FIG. 3 is a graph showing temperature-to-sensitivity characteristic exhibited by the vibration gyroscope as shown in FIG. 1.

It is assumed here that the detection signal as obtained through the piezoelectric elements 15a, 15b of the piezoelectric vibrator 11 is substantially constant at temperatures around 25° C. but becomes smaller in accordance with a fall or a rise in temperature in the lower or higher temperature region, as shown in Table 1. In such a case, the amplification factor of the amplifier circuit 30 can be changed in a manner substantially inverse to the manner in which the detection signal produced by the piezoelectric vibrator 11 varies in response to the change in the temperature as shown in FIG. 1. An example of the values of the components of the amplifier circuit 30 which can achieve such change is shown in Table 2. Consequently, any change in the level of the D.C. signal which is derived from the synchronous detector circuit 23 and which relates to the detection signal produced by the piezoelectric vibrator, caused by a change in the temperature, can effectively be compensated for by the amplifier circuit 30, whereby the sensitivity of the vibration gyroscope can be stably maintained substantially at a constant level over the entire range of temperature from low to high temperature regions, as shown in FIG. 3. Consequently, the vibration gyroscope 10 can accurately detect the rotational angular velocity over the entire temperature range of use, from low to high temperature regions.

TABLE 1

Ratio of change in response to temperature change

| Temperature | Detection signal from Piezoelectric vibrator | Amplification factor of amplifier circuit | Gyro sensitivity |
|---|---|---|---|
| −40° C. | −7.1% | 6.5% | −0.6% |
| −1° C. | −3.2% | 3.9% | 0.7% |
| 25° C. | 0.0% | 0.0% | 0.0% |
| 60° C. | −4.0% | 3.8% | −0.2% |
| 85° C. | −10.6% | 11.2% | 0.6% |

TABLE 2

| | Resistance values | B constant |
|---|---|---|
| Resistor R11 | 33.0KΩ | |
| Resistor R12 | 22.0KΩ | |
| Resistor R13 | 390.0KΩ | |
| Resistor R14 | 100.0KΩ | |
| Thermistor 35 of negative temperature T.C. | 150.0KΩ | 3800 |
| Thermistor 37 of negative temperature T.C. | 68.0KΩ | 3800 |

T.C. represents "temperature coefficient".

A description will be now given of the second embodiment of the vibration gyroscope in accordance with the present invention. In the following description of the second embodiment, the same reference numerals as those employed in the description of the first embodiment are used to denote the parts or components which are same as or equivalent to those incorporated in the first embodiment, and detailed description of such parts or components is omitted.

Figure 4:
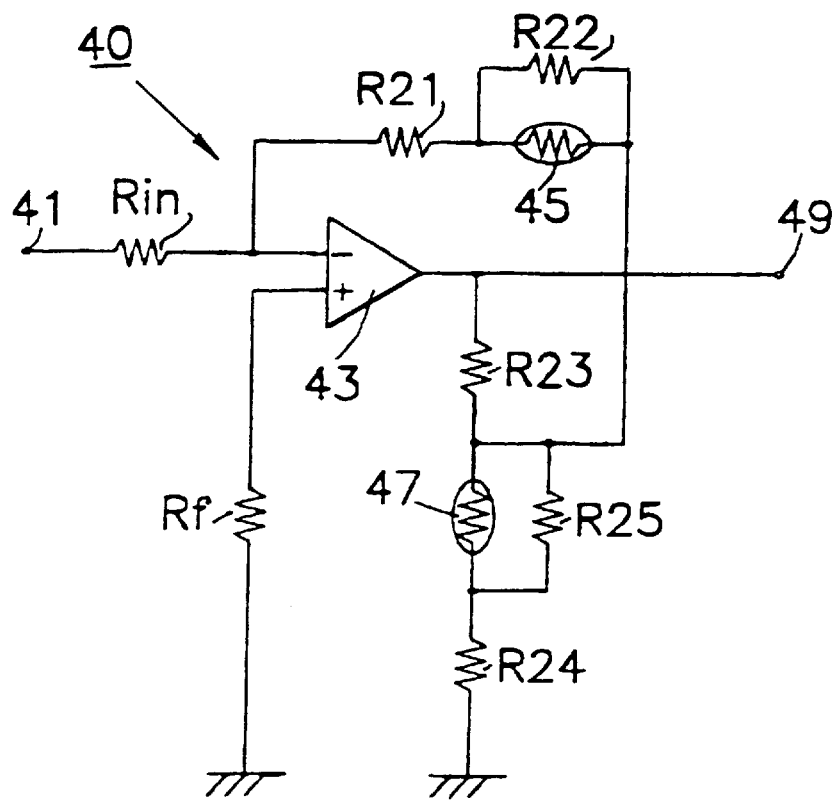
FIG. 4 is a circuit diagram showing the construction of a second embodiment of the vibration gyroscope in accordance with the present invention.

The gyroscope of the second embodiment employs an amplifier circuit having a construction different from that of the amplifier circuit used in the first embodiment. As will be seen from FIG. 4, the input terminal 41 of an amplifier circuit 40 is connected to the inversion input terminal of an operational amplifier 43, the non-inversion input terminal of which is grounded through a resistor Rf. A series circuit which is constituted by a resistor R21, a thermistor 45 having a negative temperature coefficient and a resistor R23 is connected between the non-inversion and inversion input terminals of the operational amplifier 43. The node at which the thermistor 45 of negative temperature coefficient and the resistor R23 are connected to each other is grounded through a series circuit which is constituted by a resistor R24 and a thermistor 47 of a negative temperature coefficient. The output of the operational amplifier 43 is connected to an output terminal 49.

The second embodiment of the vibration gyroscope also exhibits stable and substantially constant sensitivity over the entire temperature range from low to high temperature regions, by virtue of the temperature compensation effected by the amplifier circuit 40 on the D.C. signal which is output from the synchronous detector circuit 23.

Figure 5:
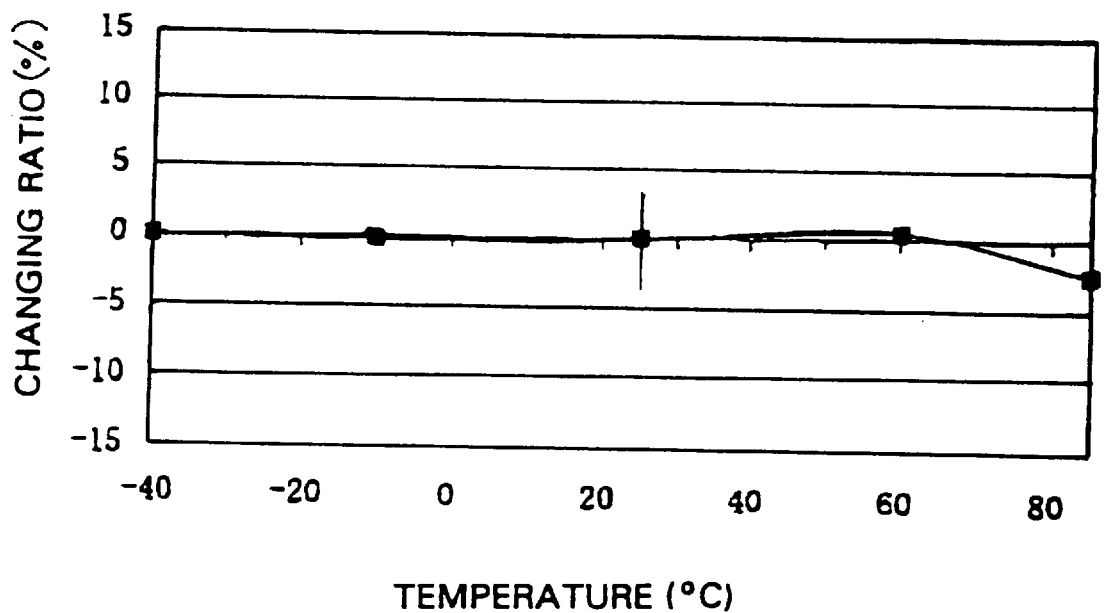
FIG. 5 is a graph showing temperature-to-sensitivity characteristic exhibited by the gyroscope of the second embodiment.

It is assumed here that the detection signal as obtained from the piezoelectric vibrator 11 is substantially constant at temperatures around 25° C. but becomes smaller in accordance with a fall or a rise in temperature in the lower or higher temperature region, as shown in Table 3. In such a case, the amplification factor of the amplifier circuit 40 can be changed in a manner substantially inverse to the manner in which the detection signal produced by the piezoelectric vibrator 11 varies in response to the change in the temperature as shown in FIG. 3. An example of the values of the components of the amplifier circuit 40 which can achieve such change is shown in Table 4. Consequently, any change in the level of the D.C. signal which is derived from the synchronous detector circuit 23 and which relates to the detection signal produced by the piezoelectric vibrator, caused by a change in the temperature, can effectively be compensated for by the amplifier circuit 40, whereby the sensitivity of the vibration gyroscope can stably maintained substantially at a constant level over the entire range of temperature from low to high temperature regions, as shown in FIG. 5. Consequently, the vibration gyroscope 10 can accurately detect the rotational angular velocity over the entire temperature range of use, from low to high temperature regions.

TABLE 3

Ratio of change in response to temperature change

| Temperature | Detection signal from Piezoelectric vibrator | Amplification factor of amplifier circuit | Gyro sensitivity |
|---|---|---|---|
| −40° C. | −7.1% | 7.1% | −0.0% |
| −10° C. | −3.2% | 3.0% | −0.2% |
| 25° C. | 0.0% | 0.0% | 0.0% |
| 60° C. | −4.0% | 4.5% | 0.5% |
| 85° C. | −10.6% | 8.1% | −2.5% |

TABLE 4

|  | Resistance values | B constant |
| --- | --- | --- |
| Resistor R21 | 33.0KΩ |  |
| Resistor R22 | 120.0KΩ |  |
| Resistor R23 | 15.0KΩ |  |
| Resistor R24 | 3.9KΩ |  |
| Resistor R25 | 470.0KΩ |  |
| Thermistor 45 of negative temperature T.C. | 47.0KΩ | 3800 |
| Thermistor 47 of negative temperature T.C. | 33.0KΩ | 3800 |

T.C. represents "temperature coefficient".
*Rin: Optional Rf: inversion input impedance A description will be now given of the third embodiment of the vibration gyroscope in accordance with the present invention. In the following description of the third embodiment, the same reference numerals as those employed in the description of the preceding embodiments are used to denote the parts or components which are same as or equivalent to those incorporated in the preceding embodiments, and detailed description of such parts or components is omitted.

Figure 6:
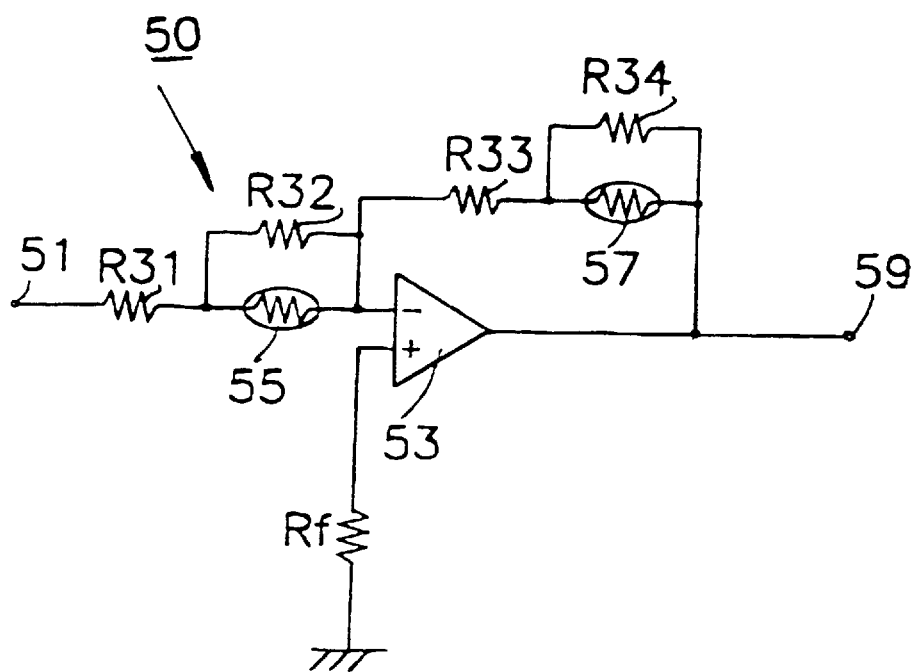
FIG. 6 is a circuit diagram of an amplifier circuit used in a third embodiment of the vibration gyroscope of the present invention.
Figure 7:
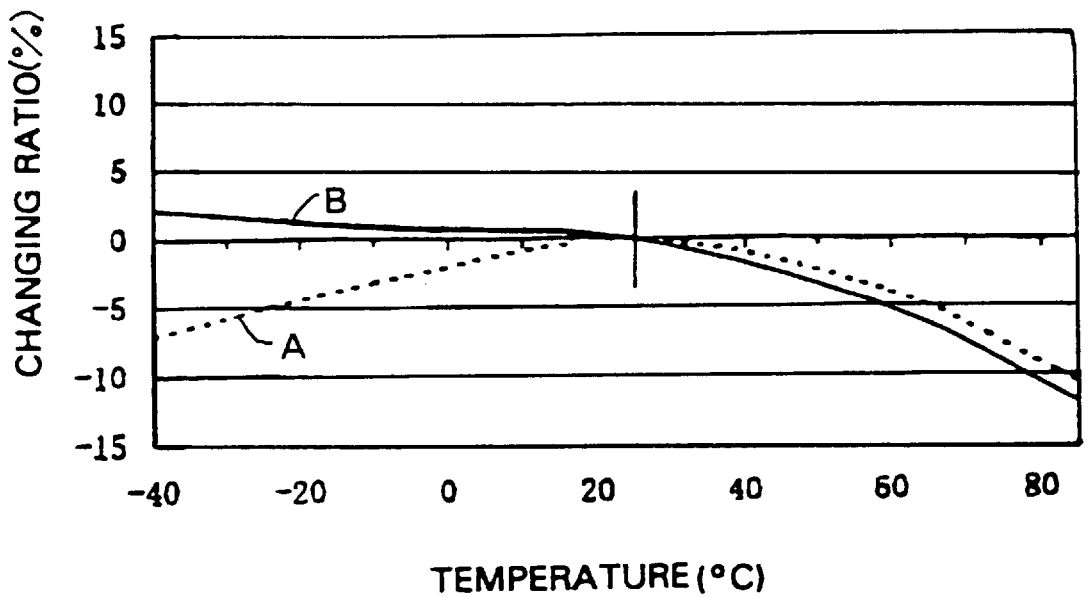
FIG. 7 is a graph showing temperature-dependency of the sensitivity characteristic of a conventional vibration gyroscope.
Figure 8:
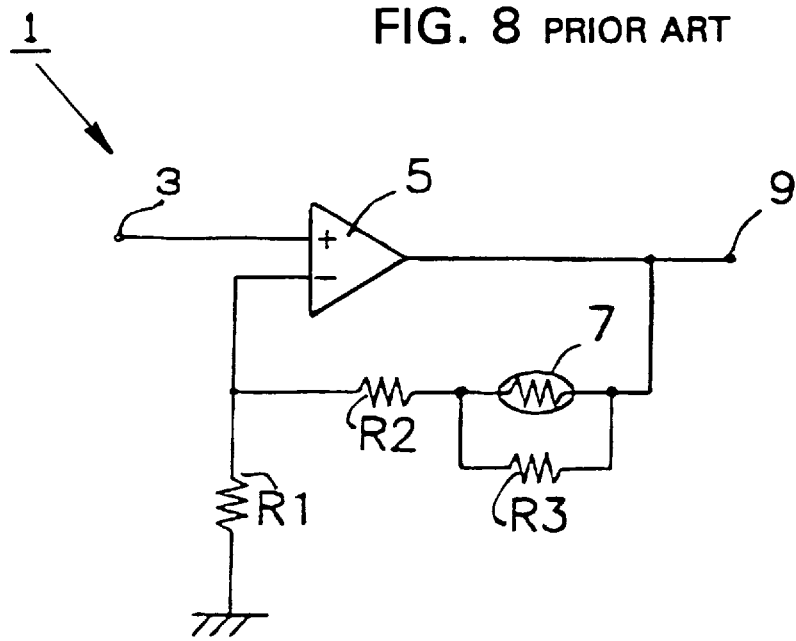
FIG. 8 is a circuit diagram showing the structure of an amplifier circuit incorporated in the conventional vibration gyroscope.

The vibration gyroscope of the third embodiment is discriminated from the first and second embodiments by the construction of the amplifier circuit. In this embodiment, as shown in FIG. 6, the input terminal 51 of the amplifier circuit, generally denoted by 50, is connected to the inversion input of an operational amplifier 53, while the non-inversion input terminal of the operational amplifier 53 is grounded through a resistor Rf. A series circuit constituted by a resistor R31 and a thermistor 55 having a negative temperature coefficient is connected between the input terminal 51 and the inversion input terminal of the operational amplifier 53. Resistor R32 is connected in parallel with the thermistor 55 of negative temperature coefficient. A series circuit constituted by a resistor R33 and a thermistor 57 having a negative temperature coefficient is connected between the inversion input and the output of the operational amplifier 53. A resistor R34 is connected in parallel with the thermistor 57 of negative temperature coefficient. The output of the operational amplifier 53 is connected to the output terminal 59 of the amplifier circuit 50.

In the vibration gyroscope of the third embodiment as described, the amplifier circuit 50, like the amplifier circuits 30 and 40 of the first and second embodiments, effects temperature compensation on the D.C. signal derived from the synchronous detector circuit 23, on condition that the parameters of components of the amplifier circuit 50 are selected such that the amplification factor of the amplifier circuit 50 varies in a manner inverse to that of the detection signal derived from the piezoelectric vibrator 11 in response to a change in temperature. Consequently, the sensitivity of the vibration gyroscope can stably be maintained substantially constant, so as to ensure a high degree of accuracy of detection of rotational angular velocity over the entire temperature range from low to high temperature regions.

Although the invention has been described through its specific terms, it is to be understood that the described embodiments are only illustrative and various changes and modifications may be imparted thereto.

For instance, the described embodiments may be modified so as to employ thermistors of positive temperature coefficients as the temperature-sensitive elements, although the described embodiments employ thermistors having negative temperature coefficients. It is also possible to use thin metal films of, for example, platinum or nickel, as the temperature-sensitive elements.

In the described embodiments, the piezoelectric vibrator 11 is constituted by a columnar metallic vibration member 13 having an equilateral-triangular cross-section and three piezoelectric members 15a, 15b, 15c provided thereon. This construction of the piezoelectric vibrator is only illustrative and the piezoelectric vibrator may be constituted by a vibration member made of a piezoelectric material and a plurality of electrodes formed on the surface of the piezoelectric vibration member. It is also to be understood that the equilateral-triangular cross-section of the vibration member of the piezoelectric vibrator is not exclusive, and various other cross-sectional shapes such a polygonal shape, e.g., square, or a circular shape, may be employed for the columnar vibration member. The number of the piezoelectric elements and, hence, the number of the electrodes of the piezoelectric vibrator may be varied as desired.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A vibration gyroscope, comprising:

a piezoelectric vibrator which generates a detection signal which varies with temperature; and an amplifier circuit which amplifies a detection signal derived from said piezoelectric vibrator;

said amplifier circuit including an operational amplifier and at least two temperature-sensitive elements which are arranged in a circuit with said operational amplifier such that the amplification factor of said operational amplifier varies inversely to the variation in the detection signal caused by a change in temperature, said amplifier circuit further including an input terminal which is connected to an inversion input of said operational amplifier, a non-inversion input of said operational amplifier being grounded; and an output terminal connected to an output of said operation amplifier; and wherein said at least two temperature-sensitive elements include a first temperature-sensitive element connected between the inversion input of said operation amplifier and the output of said operation amplifier, and a second temperature-sensitive element connected between said output of said operation amplifier and the ground.

2. A vibration gyroscope according to claim 1, wherein each of the first and second temperature-sensitive elements is a thermistor having a negative temperature coefficient.

3. A vibration gyroscope, comprising:

a piezoelectric vibrator which generates a detection signal which varies with temperature; and an amplifier circuit which amplifies a detection signal derived from said piezoelectric vibrator;

said amplifier circuit including an operational amplifier and at least two temperature-sensitive elements which are arranged in a circuit with said operational amplifier such that the amplification factor of said operational amplifier varies inversely to the variation in the detection signal caused by a change in temperature, said amplifier circuit further including an input terminal which is connected to the inversion input of said operational amplifier, the non-inversion input of said operational amplifier being grounded; and an output terminal connected to the output of said operational amplifier; and wherein said at least two temperature-sensitive elements include a first temperature-sensitive element connected between said input terminal and the inversion input of said operational amplifier, and a second temperature-sensitive element connected between said inversion input of said operational amplifier and said output of said operational amplifier.

4. A vibration gyroscope according to claim 3, wherein each of the first and second temperature-sensitive elements is a thermistor having a negative temperature coefficient.

5. A vibration gyroscope comprising:

a piezoelectric vibrator which generates a detection signal which varies with temperature; and an amplifier circuit which amplifies a detection signal derived from said piezoelectric vibrator;

said amplifier circuit including:

an operational amplifier having an inversion input, non-inversion input and output; a series circuit of a first resistor and a first thermistor, connected between the inversion input and a ground potential; a second resistor connected in parallel with the first thermistor; a series circuit of a third resistor and a second thermistor, connected between the output and the inversion input; a fourth resistor connected in parallel with the second thermistor; and input terminal connected to the non-inversion input; and an output terminal connected to the output of the operational amplifier.

6. A vibration gyroscope according to claim 5, wherein the first and second thermistors have a negative temperature coefficient.

7. A vibration gyroscope according to claim 5, wherein resistances of the first to fourth resistors and characteristics of the first and second thermistor are so selected that the vibration gyroscope has an S-shaped temperature-to sensitivity characteristic curve.

8. A vibration gyroscope comprising:

a piezoelectric vibrator which generates a detection signal which varies with temperature; and an amplifier circuit which amplifies a detection signal derived from said piezoelectric vibrator;

said amplifier circuit including:

an operational amplifier having an inversion input, non-inversion input and output; a series circuit of a first resistor, a first thermistor and a second resistor, connected between the inversion input and the output; a third resistor connected in parallel with the first thermistor; a series circuit of a fourth resistor and a second thermistor, connected between the inversion input and a connection point of the second resistor and the first thermistor; a first resistor connected in parallel with the second thermistor; an input terminal connected to the inversion input; and an output terminal connected to the output of the operational amplifier.

9. A vibration gyroscope according to claim 8, wherein the first and second thermistors have a negative temperature coefficient.

10. A vibration gyroscope according to claim 8, wherein resistances of the first to fifth resistors and characteristics of the first and second thermistor are so selected that the vibration gyroscope has an S-shaped temperature-to sensitivity characteristic curve.

* * * * *